United States Patent
Lee et al.

(10) Patent No.: US 12,400,412 B2
(45) Date of Patent: Aug. 26, 2025

(54) METHOD FOR MODIFYING DESIGN ON BASIS OF ADDITIVE CROSS-SECTION OUTLINE FOR 3D PRINTING

(71) Applicant: Korea Electronics Technology Institute, Seongnam-si (KR)

(72) Inventors: Hye In Lee, Anyang-si (KR); Hwa Seon Shin, Yongin-si (KR); Sung Hwan Chun, Seoul (KR); Sung Hun Park, Seoul (KR)

(73) Assignee: Korea Electronics Technology Institute, Seongnam-si (KR)

( * ) Notice: Subject to any disclaimer, the term of this patent is extended or adjusted under 35 U.S.C. 154(b) by 188 days.

(21) Appl. No.: 18/038,785

(22) PCT Filed: Nov. 3, 2021

(86) PCT No.: PCT/KR2021/015750
§ 371 (c)(1),
(2) Date: May 25, 2023

(87) PCT Pub. No.: WO2022/114568
PCT Pub. Date: Jun. 2, 2022

(65) Prior Publication Data
US 2024/0005620 A1    Jan. 4, 2024

(30) Foreign Application Priority Data
Nov. 25, 2020  (KR) .......... 10-2020-0159494

(51) Int. Cl.
*G06T 19/20*    (2011.01)
*B29C 64/386*    (2017.01)
(Continued)

(52) U.S. Cl.
CPC ............ *G06T 19/20* (2013.01); *B29C 64/386* (2017.08); *B33Y 50/00* (2014.12); *G06T 17/20* (2013.01); *G06T 2219/2021* (2013.01)

(58) Field of Classification Search
None
See application file for complete search history.

(56) References Cited

U.S. PATENT DOCUMENTS

| | | | |
|---|---|---|---|
| 2016/0103934 A1* | 4/2016 | Kao | B33Y 50/00 700/98 |
| 2019/0001578 A1* | 1/2019 | Usami | B29C 64/147 |

(Continued)

*Primary Examiner* — Andrew G Yang
(74) *Attorney, Agent, or Firm* — NSIP Law

(57) ABSTRACT

Provided is a method for modifying a design on the basis of an additive cross-section outline for 3D printing of an additive manufacturing method. The method for modifying a design on the basis of an additive cross-section outline according to an embodiment of the present invention comprises the steps of: slicing a 3D model into a plurality of 2D layers; calculating a difference region between a first layer and a second layer that is a lower layer adjacent to the first layer; calculating a modified outline that minimizes a region required for support by reducing the outline of the difference region; and merging the modified outline and the outline of the second layer. Accordingly, a design can be modified with fewer calculation processes compared to the prior art, models can be modified for additive manufacturing without additional design knowledge, and since the design has been modified to minimize the region required for support, the amount of support can be reduced, thereby increasing material or printing time efficiency, and strengthening a design structure.

16 Claims, 5 Drawing Sheets

(51) Int. Cl.
*B33Y 50/00* (2015.01)
*G06T 17/20* (2006.01)

(56) References Cited

U.S. PATENT DOCUMENTS

| | | | |
|---|---|---|---|
| 2019/0051044 A1* | 2/2019 | Chui | G06T 15/04 |
| 2019/0152155 A1* | 5/2019 | Gonzalez | B29C 64/386 |
| 2021/0299962 A1* | 9/2021 | Qian | B29C 64/393 |

* cited by examiner

METHOD FOR MODIFYING DESIGN ON BASIS OF ADDITIVE CROSS-SECTION OUTLINE FOR 3D PRINTING

CROSS REFERENCE TO RELATED APPLICATIONS

This application is a U.S. National Stage Application of International Application No. PCT/KR2021/015750, filed on Nov. 3, 2021, which claims the benefit under 35 USC 119(a) and 365(b) of Korean Patent Application No. 10-2020-0159494, filed on Nov. 25, 2020, in the Korean Intellectual Property Office, the entire disclosure of which is incorporated herein by reference for all purposes.

TECHNICAL FIELD

The disclosure relates to 3-dimensional (3D) printing technology, and more particularly, to a method for modifying a design based on an additive cross-section outline for 3D printing of an additive manufacturing method.

BACKGROUND ART

Since an existing 3D printing design model is made through a cutting process whereby a shape is made by cutting a large mass, it may not be appropriate to an additive manufacturing method which builds an object by adding layers.

Additive manufacturing requires a support structure for supporting an output material while making a shape of a design model (while outputting layers one by one), and the support structure should be removed after outputting is finished.

In this case, since the output material may be deformed or a mark may be left on a surface in a post-processing process of removing the support structure after outputting, minimizing the support structure may be an important issue in a processing process.

However, when there are many supports, an output time and an amount of used materials increase, and also, a post-processing cost may increase. On the other hand, when there are few supports, output itself may fail. Therefore, a design model may be rotated in order to generate an appropriate number of supports or some designs may be modified to be appropriate to additive manufacturing.

As a related-art method of modifying some designs, a finite element method-based topology optimization technique may be used. In this method, topology optimization calculation may be performed after an existing mesh model (a hollowed model) is converted into a volume model (a solid model), and the volume model may be converted back to the mesh model. Therefore, there is a problem of a large amount of calculation.

Specifically, researches are ongoing to reduce 3D mesh-based support requiring areas for topology optimization when the finite element method-based topology optimization technique is used, but there is a problem that the 3D mesh-based support requiring areas do not completely match additive cross-section-based support requiring areas which result in real output.

DISCLOSURE

Technical Problem

The disclosure has been developed in order to address the above-discussed deficiencies of the prior art, and an object of the disclosure is to provide an additive cross-section outline-based design modification method which can strengthen a structure of a design model while reducing the number of supports by modifying a shape of an additive cross-section outline so as to minimize support requiring areas.

Technical Solution

According to an embodiment of the disclosure to achieve the above-described object, a method for modifying a design based on an additive cross-section outline may include: slicing a 3D model into a plurality of 2D layers; calculating a difference area between a first layer and a second layer which is a lower layer adjacent to the first layer; calculating a modified outline for minimizing a support requiring area by reducing an outline of the difference area; and merging the modified outline and an outline of the second layer.

In addition, slicing may include calculating an outline of an additive cross-section by cutting inputted 3D mesh data as much as a layer thickness along a Z axis in order to generate the additive cross-section.

In addition, calculating the difference area may include calculating the difference area (Sn) which is a support requiring area by subtracting an additive cross-section outline of the second layer from the first layer.

In addition, calculating the modified outline may include calculating the modified outline based on the first layer and the difference area (Sn).

In addition, calculating the modified outline may include including peaks thar are derived from the second layer among all peaks constituting the difference area (Sn) in a set of peaks constituting the modified outline.

In addition, calculating the modified outline may include calculating coordinates of a peak (P) that is not derived from the second layer among all peaks constituting the difference area (Sn) by using the following equation, and including the peak (P) the coordinates of which are calculated in the set of peaks constituting the modified outline:

$$P=(h, h^* \tan \theta)$$

where h is a thickness of the second layer and θ is an angle for determining generation of a support area.

In addition, merging the outlines may include modifying the outline of the second layer by merging the calculated modified outline and the second layer.

In addition, according to an embodiment, the method may further include constructing a mesh by combining peaks of outlines of the first layer and the second layer.

According to another embodiment of the disclosure, constructing the mesh may include generating 3D mesh data by combining peaks of the modified outline and the first layer.

According to another embodiment of the disclosure, a system for modifying a design based on an additive cross-section outline may include: a processor configured to slice a 3D model into a plurality of 2D layers, to calculate a difference area between a first layer and a second layer which is a lower layer adjacent to the first layer, to calculate a modified outline for minimizing a support requiring area by reducing an outline of the difference area, and to merge the modified outline and an outline of the second layer; and an output unit configured to output information regarding 2D layers forming a 3D model on a screen.

According to still another embodiment of the disclosure, a method for modifying a design based on an additive cross-section outline may include: calculating a difference area between a sliced first layer and a second layer which is a lower layer adjacent to the first layer; calculating a modified outline for minimizing a support requiring area by reducing an outline of the difference area; and merging the modified outline and an outline of the second layer.

In addition, according to yet another embodiment of the disclosure, there is provided a computer-readable recording medium having a program recorded thereon to perform a method for modifying a design based on an additive cross-section outline, the method including: calculating a difference area between a sliced first layer and a second layer which is a lower layer adjacent to the first layer; calculating a modified outline for minimizing a support requiring area by reducing an outline of the difference area; and merging the modified outline and an outline of the second layer.

Advantageous Effects

According to embodiments of the disclosure as described above, a design may be modified with fewer calculation processes compared to a related-art method, and a model may be modified for additive manufacturing without additional design knowledge, and since the design is modified to minimize a support requiring area, the number of supports may be reduced, and material or output time efficiency may be enhanced, and a design structure may be strengthened.

BEST MODE

Hereinafter, the disclosure will be described in more detail with reference to the drawings.

Figure 1:
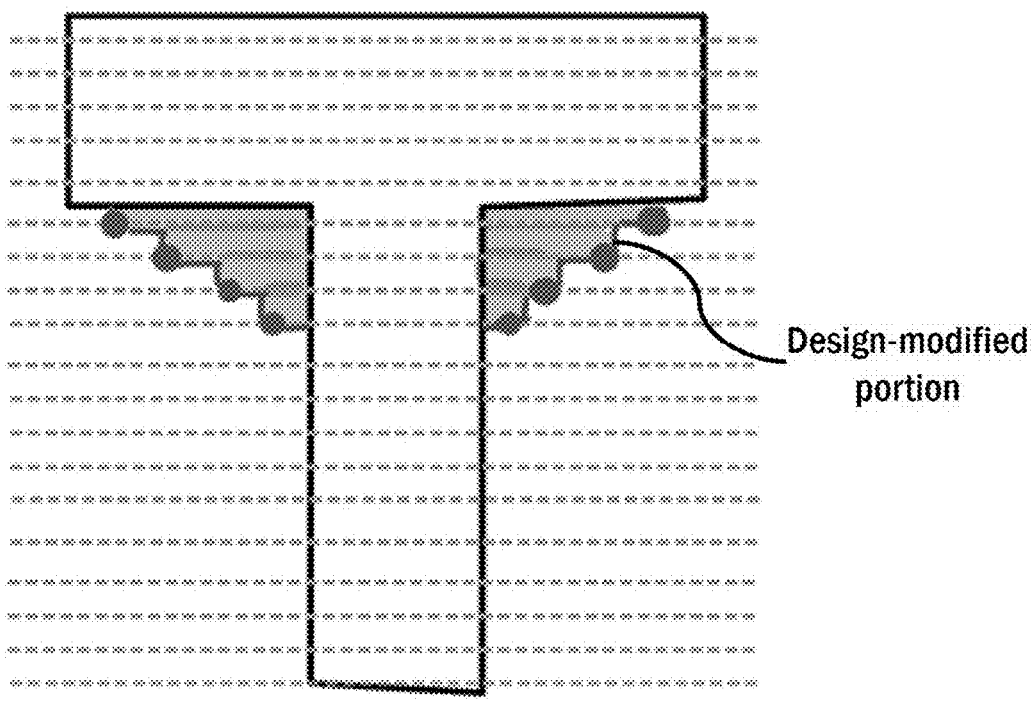
FIG. 1 is a view illustrating a structure of a design model which is strengthened by modifying a design based on an additive cross-section outline according to an embodiment of the disclosure.
Figure 2:
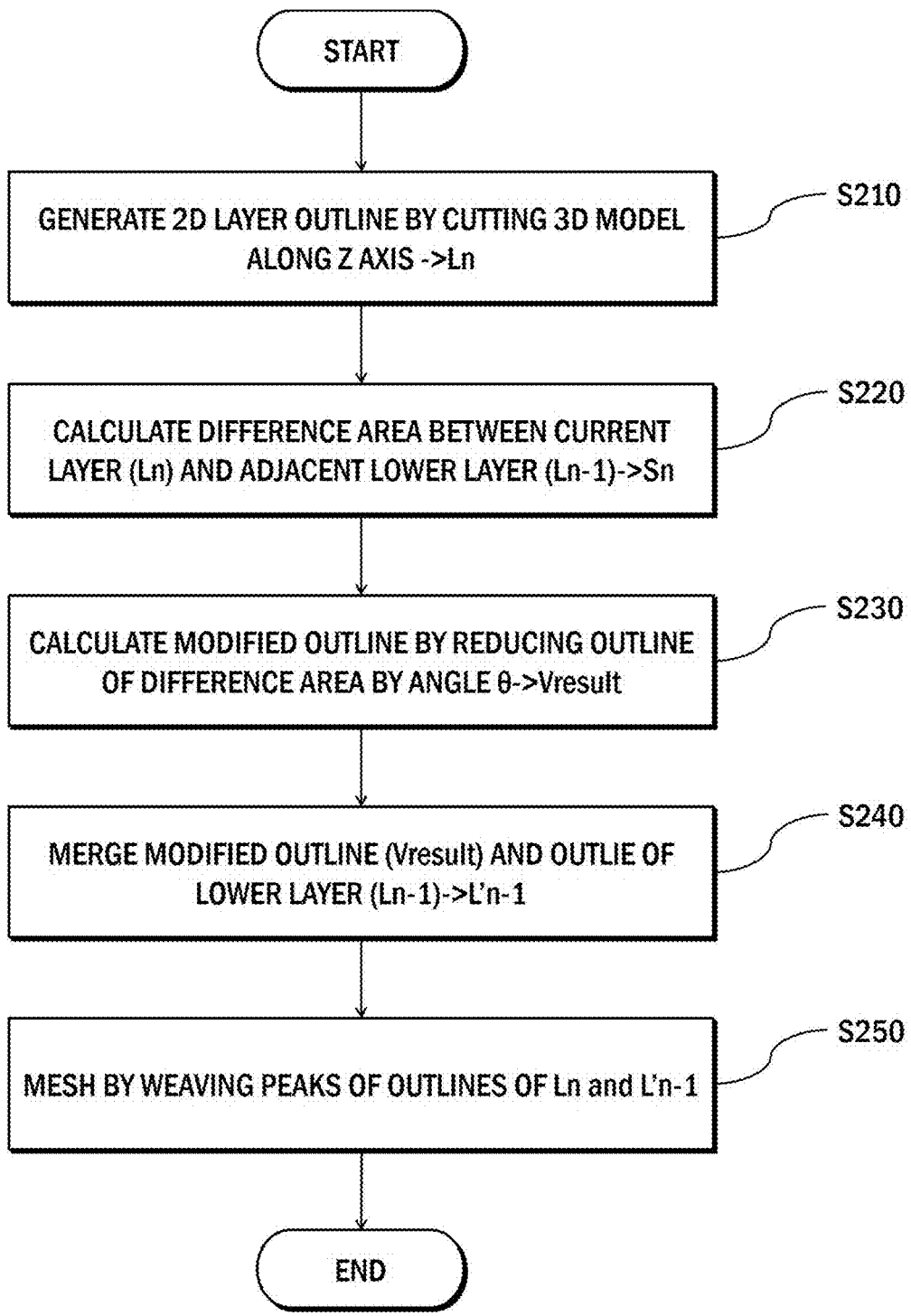
FIG. 2 is a flowchart provided to explain an additive cross-section outline-based design modification method according to an embodiment of the disclosure.

FIG. 1 is a view illustrating a structure of a design model which is strengthened by modifying a design based on an additive cross-section outline according to an embodiment of the disclosure, and FIG. 2 is a flowchart provided to explain an additive cross-section outline-based design modification method according to an embodiment of the disclosure.

The additive cross-section outline-based design modification method according to an embodiment of the disclosure is provided to strengthen a structure of a design model while reducing the number of supports by modifying a shape of an additive cross-section outline in order to minimize support requiring areas as shown in FIG. 1.

That is, the additive cross-section outline-based design modification method may modify a design based on an additive cross-section, which is different from a related-art method using ontology optimization by using an infinite element method, and may minimize support requiring areas through modification of the design and may strengthen the design structure, and, since the method is based on an additive cross-section, a shape is modified according to an output area and a thickness, and accordingly, the design may match real output.

To achieve this, the additive cross-section outline-based design modification method of the disclosure may include: a 3D model slicing step (S210) of slicing a 3D model into a plurality of 2D layers; a difference area calculation step (S220) of calculating a difference area between a first layer and a second layer which is a lower layer adjacent to the first layer; a modified outline calculation step (S230) of calculating a modified outline to minimize a support requiring area by reducing an outline of the difference area; an outline merging step (S240) of merging the modified outline and an outline of the second layer; and a mesh construction step (S250) of constructing a mesh by combining peaks of the outlines of the first layer and the second layer.

At the 3D model slicing step (S210), the method may calculate an outline of an additive cross-section by cutting inputted 3D mesh data as much as a layer thickness along a Z-axis in order to generate an additive cross-section.

At the difference area calculation step (S220), the method may calculate a difference area Sn which is a support requiring area by subtracting an additive cross-section outline of the second layer from the first layer.

At the modified outline calculation step (S230), the method may calculate a modified outline from the first layer Ln and the difference area Sn, by considering that an angle θ for determining generation of a support area varies according to material characteristics and an output method.

The modified outline calculation step (S230) will be described in detail with reference to FIGS. 3 to 4.

At the outline merging step (S240), the method may modify (update) the outline of the second layer by merging the calculated modified outline and the second layer.

Herein, when the outline merging step (S240) is completed, 2D outline data having a modified design may be generated, and, when a real output path is generated, the modified 2D outline data may be used.

At the mesh construction step (S250), the method may generate 3D mesh data by combining peaks of the modified outline and the first layer, and this step may be omitted when rendering is not performed on a 3D graphic screen.

The additive cross-section outline-based design modification method may repeat the above-described steps from the 3D model slicing step (S210) to the mesh construction step (S250) with respect to all layers, and may calculate a modified outline to minimize a support requiring area and may derive a new design outline having a strengthened structure by mering the modified outline and a design area outline.

Figure 3:
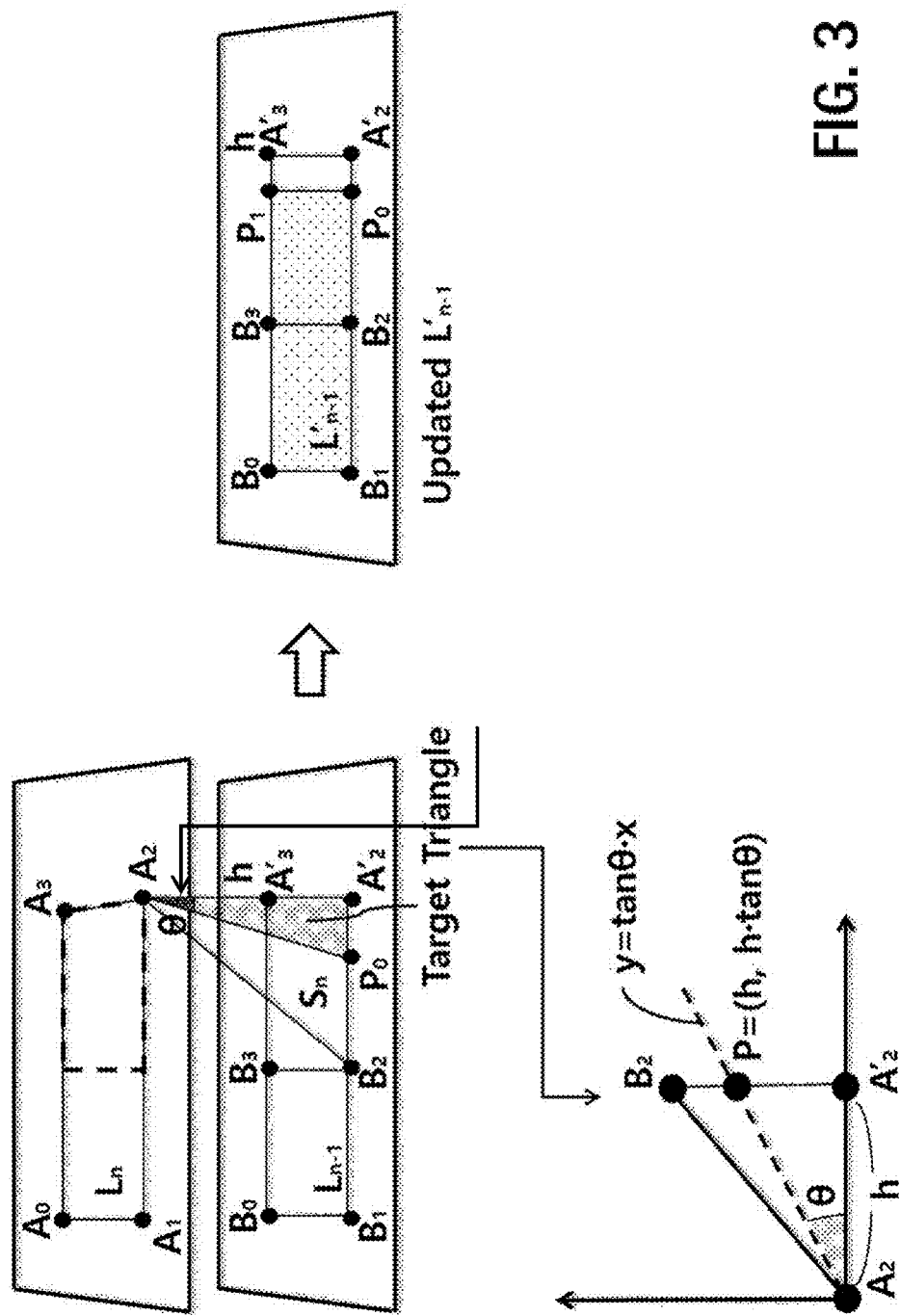
FIG. 3 is a view provided to explain a process of calculating a modified outline according to an embodiment of the disclosure.
Figure 4:
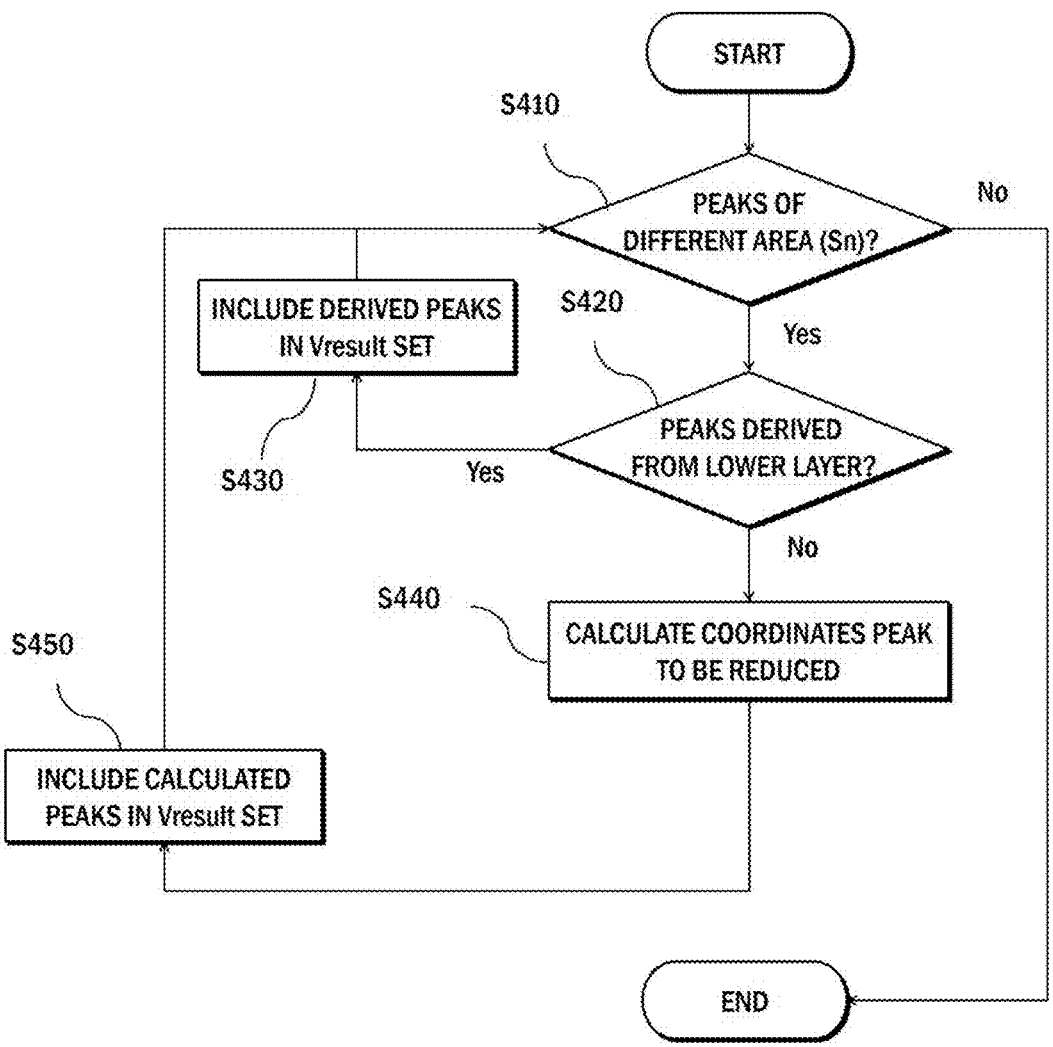
FIG. 4 is a flowchart provided to explain a method for calculating a modified outline according to an embodiment of the disclosure.

FIG. 3 is a view provided to explain a process of calculating a modified outline according to an embodiment of the disclosure, and FIG. 4 is a flowchart provided to explain a method of calculating a modified outline according to an embodiment of the disclosure.

At the modified outline calculation step as described above, a modified outline may be calculated from the first layer Ln and the difference area Sn by considering that the angle θ for determining generation of a support area varies according to material characteristics or an output method.

Specifically, at the modified outline calculation step, it may be determined whether there are peaks constituting the difference area among all peaks in order to calculate the modified outline (S410), and, when there are peaks constituting the difference area (S410—Yes), it may be determined whether the peaks are derived from the second layer which is a lower layer adjacent to the first layer (S420).

Referring to FIG. 3, it may be determined whether there are peaks constituting the difference area Sn among all peaks including A0, A1, A2, A3, B0, B1, B2, B3, A'3, A'2, and it may be determined whether peaks B2, B3, A'3, and A' 2 determined as peaks constituting the difference area are peaks derived from the second layer.

When the peaks that are determined as peaks constituting the difference area are peaks derived from the second layer (S420—Yes), the peaks derived from the second layer may be set to be included in a set of peaks constituting the modified outline (S430).

In FIG. 3, B2, B3 are peaks derived from the second layer, and may be included in a set of peaks constituting the modified outline.

On the other hand, when the peaks determined as peaks constituting the difference area are not derived from the second layer (S420—N), coordinates of the corresponding peak P may be calculated by using the following equation (S440):

$$P=(h, h*\tan \theta)$$

where h is a thickness of the second layer and θ is an angle for determining generation of a support area.

In addition, the peak P the coordinates of which are calculated may be set to be included in the set of peaks constituting the modified outline (S450), and calculation of the modified outline for all peaks that are determined as peaks constituting the difference area may be completed.

Since A'3, A'2 are not the peaks derived from the second layer in FIG. 3, calculation of the modified outline may be completed by calculating coordinates of P1, P0 by using the above-described equation and setting P1, P0 to be included in the set of peaks constituting the modified outline.

In addition, the calculated modified outline and the second layer outline may be merged at the outline merging step, such that existing Ln−1 which has peaks B0, B1, B2, B3 may be modified to L'n−1 having peaks B0, B1, P0, P1.

Through this, a design may be modified with fewer calculation processes compared to a related-art method, and a model may be modified for additive manufacturing without additional design knowledge, and since the design is modified to minimize a support requiring area, the number of supports may be reduced, and material or output time efficiency may be enhanced, and a design structure may be strengthened.

Figure 5:
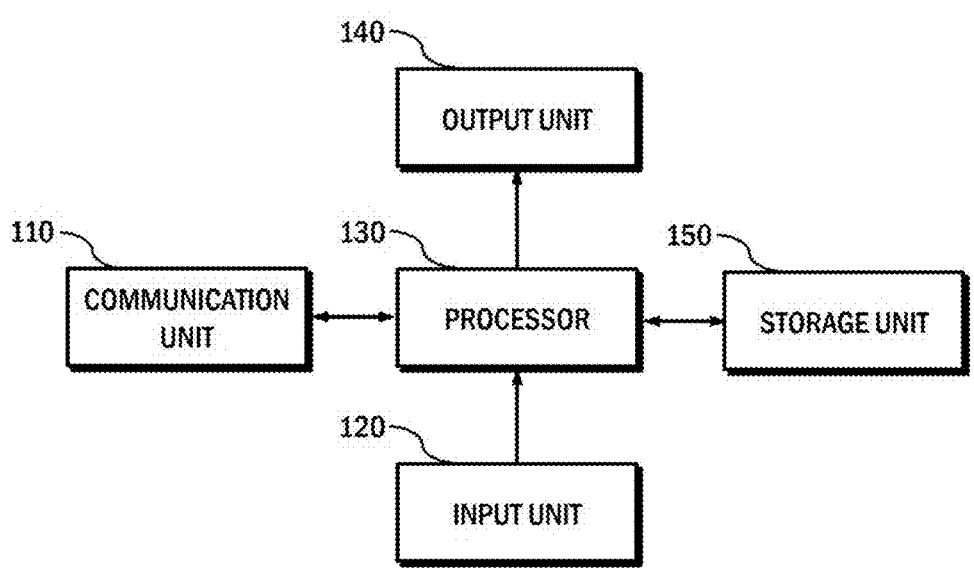
FIG. 5 is a view provided to explain an additive cross-section outline-based design modification system according to an embodiment of the disclosure.

FIG. 5 is a view provided to explain an additive cross-section outline-based on design modification system according to an embodiment of the disclosure.

Referring to FIG. 5, the additive cross-section outline-based design modification system according to the present embodiment may include a communication unit 110, an input unit 120, a processor 130, an output unit 140, and a storage unit 150.

The communication unit 110 is a means for communicating with external devices including 3D printers and connecting to a server, a cloud through a network, and may transmit/receive/upload/download data necessary for 3D printing.

The input unit 120 is a means for receiving settings/commands related to 3D printing and generation of a support structure.

The processor 130 may perform the additive cross-section outline-based design modification method described above with reference to FIGS. 1 to 4.

Specifically, the processor 130 may slice a 3D model into a plurality of 2D layers, may calculate a difference area between a first layer and a second layer which is a lower layer adjacent to the first layer, may calculate a modified outline for minimizing a support requiring area by reducing an outline of the difference area, may merge the modified outline and an outline of the second layer, and may generate 3D mesh data by combining peaks of the modified outline and the first layer.

The output unit 140 is a display that outputs information regarding 2D layers forming a 3D model on a screen, and the storage unit 150 is a storage medium that provides a storage space necessary for normal operations of the processor 130.

The technical concept of the disclosure may be applied to a computer-readable recording medium which records a computer program for performing the functions of the apparatus and the method according to the present embodiments. In addition, the technical idea according to various embodiments of the disclosure may be implemented in the form of a computer readable code recorded on the computer-readable recording medium. The computer-readable recording medium may be any data storage device that can be read by a computer and can store data. For example, the computer-readable recording medium may be a read only memory (ROM), a random access memory (RAM), a CD-ROM, a magnetic tape, a floppy disk, an optical disk, a hard disk drive, or the like. A computer readable code or program that is stored in the computer readable recording medium may be transmitted via a network connected between computers.

In addition, while preferred embodiments of the disclosure have been illustrated and described, the disclosure is not limited to the above-described specific embodiments. Various changes can be made by a person skilled in the art without departing from the scope of the disclosure claimed in claims, and also, changed embodiments should not be understood as being separate from the technical idea or prospect of the disclosure.

The invention claimed is:

1. A method for modifying a design based on an additive cross-section outline, the method comprising:
    slicing a 3D model into a plurality of 2D layers;
    calculating a difference area between a first layer and a second layer which is a lower layer adjacent to the first layer;
    calculating a modified outline for minimizing a support requiring area by reducing an outline of the difference area; and
    merging the modified outline and an outline of the second layer,
    wherein the calculating the difference area comprises calculating the difference area (Sn) which is a support requiring area by subtracting an additive cross-section outline of the second layer from the first layer,
    wherein the calculating the modified outline comprises calculating the modified outline based on the first layer and the difference area (Sn),
    wherein the calculating the modified outline comprises including peaks that are derived from the second layer among all peaks constituting the difference area (Sn) in a set of peaks constituting the modified outline, and
    wherein the calculating the modified outline comprises calculating coordinates of a peak (P) that is not derived from the second layer among all peaks constituting the difference area (Sn) by using the following equation, and including the peak (P) the coordinates of which are calculated in the set of peaks constituting the modified outline:

$$P=(h, h*\tan \theta)$$

where h is a thickness of the second layer and θ is an angle for determining generation of a support area.

2. The method of claim 1, wherein the slicing comprises calculating an outline of the additive cross-section by cutting inputted 3D mesh data as much as a layer thickness along a Z axis in order to generate the additive cross-section.

3. The method of claim 1, wherein the merging the outlines comprises modifying the outline of the second layer by merging the calculated modified outline and the second layer.

4. The method of claim 1, further comprising constructing a mesh by combining peaks of outlines of the first layer and the second layer.

5. The method of claim 4, wherein the constructing the mesh comprises generating 3D mesh data by combining peaks of the modified outline and the first layer.

6. A system for modifying a design based on an additive cross-section outline, the system comprising:
a processor configured to slice a 3D model into a plurality of 2D layers, to calculate a difference area between a first layer and a second layer which is a lower layer adjacent to the first layer, to calculate a modified outline for minimizing a support requiring area by reducing an outline of the difference area, and to merge the modified outline and an outline of the second layer; and
an output unit configured to output information regarding the plurality of 2D layers forming the 3D model on a screen,
wherein, for the calculating the difference area, the processor is configured to calculate the difference area (Sn) which is a support requiring area by subtracting an additive cross-section outline of the second layer from the first layer,
wherein, for the calculating the modified outline, the processor is configured to calculate the modified outline based on the first layer and the difference area (Sn),
wherein, for the calculating the modified outline, the processor is configured to include peaks that are derived from the second layer among all peaks constituting the difference area (Sn) in a set of peaks constituting the modified outline, and
wherein, for the calculating the modified outline, the processor is configured to calculate coordinates of a peak (P) that is not derived from the second layer among all peaks constituting the difference area (Sn) by using the following equation, and include the peak (P) the coordinates of which are calculated in the set of peaks constituting the modified outline:

$$P=(h, h*\tan \theta)$$

where h is a thickness of the second layer and θ is an angle for determining generation of a support area.

7. The system of claim 6, wherein, for the slicing, the processor is configured to calculate an outline of the additive cross-section by cutting inputted 3D mesh data as much as a layer thickness along a Z axis in order to generate the additive cross-section.

8. The system of claim 6, wherein, for the merging the outlines, the processor is configured to modify the outline of the second layer by merging the calculated modified outline and the second layer.

9. The system of claim 6, wherein the processor is configured to construct a mesh by combining peaks of outlines of the first layer and the second layer.

10. The system of claim 9, wherein, for the constructing the mesh, the processor is configured to generate 3D mesh data by combining peaks of the modified outline and the first layer.

11. A method for modifying a design based on an additive cross-section outline, the method comprising:
calculating a difference area between a sliced first layer and a second layer which is a lower layer adjacent to the first layer;
calculating a modified outline for minimizing a support requiring area by reducing an outline of the difference area; and
merging the modified outline and an outline of the second layer,
wherein the calculating the difference area comprises calculating the difference area which is a support requiring area by subtracting an additive cross-section outline of the second layer from the first layer,
wherein the calculating the modified outline comprises calculating the modified outline based on the first layer and the difference area,
wherein the calculating the modified outline comprises including peaks that are derived from the second layer among all peaks constituting the difference area in a set of peaks constituting the modified outline, and
wherein the calculating the modified outline comprises calculating coordinates of a peak (P) that is not derived from the second layer among all peaks constituting the difference area (Sn) by using the following equation, and including the peak (P) the coordinates of which are calculated in the set of peaks constituting the modified outline:

$$P=(h, h*\tan \theta)$$

where h is a thickness of the second layer and θ is an angle for determining generation of a support area.

12. A non-transitory computer-readable storage medium storing instructions that, when executed by a processor, cause the processor to perform the method of claim 11.

13. The method of claim 11, wherein the slicing comprises calculating an outline of the additive cross-section by cutting inputted 3D mesh data as much as a layer thickness along a Z axis in order to generate the additive cross-section.

14. The method of claim 11, wherein the merging the outlines comprises modifying the outline of the second layer by merging the calculated modified outline and the second layer.

15. The method of claim 11, further comprising constructing a mesh by combining peaks of outlines of the first layer and the second layer.

16. The method of claim 15, wherein the constructing the mesh comprises generating 3D mesh data by combining peaks of the modified outline and the first layer.

* * * * *